(12) United States Patent
Teboulle et al.

(10) Patent No.: US 10,985,803 B2
(45) Date of Patent: Apr. 20, 2021

(54) DEVICE FOR RECEIVING PLC SIGNALS

(71) Applicant: SAGEMCOM ENERGY & TELECOM SAS, Rueil Malmaison (FR)

(72) Inventors: Henri Teboulle, Rueil Malmaison (FR); Christophe Grincourt, Rueil Malmaison (FR)

(73) Assignee: SAGEMCOM ENERGY & TELECOM SAS, Rueil Malmaison (FR)

(*) Notice: Subject to any disclaimer, the term of this patent is extended or adjusted under 35 U.S.C. 154(b) by 0 days.

(21) Appl. No.: 16/705,901

(22) Filed: Dec. 6, 2019

(65) Prior Publication Data

US 2020/0186197 A1  Jun. 11, 2020

(30) Foreign Application Priority Data

Dec. 10, 2018 (FR) ..................... 18 72632

(51) Int. Cl.

| H04B 3/58 | (2006.01) |
|---|---|
| H04B 3/56 | (2006.01) |
| G01D 4/00 | (2006.01) |
| G08C 19/00 | (2006.01) |
| H03H 11/12 | (2006.01) |
| H04B 3/54 | (2006.01) |
| H04L 27/26 | (2006.01) |

(52) U.S. Cl.
CPC ............... *H04B 3/56* (2013.01); *G01D 4/004* (2013.01); *G08C 19/00* (2013.01); *H03H 11/1204* (2013.01); *H04B 3/544* (2013.01); *H04L 27/2628* (2013.01); *H04B 2203/5433* (2013.01); *H04B 2203/5491* (2013.01)

(58) Field of Classification Search
CPC ........................................ H04B 1/38
See application file for complete search history.

(56) References Cited

U.S. PATENT DOCUMENTS

| 7,949,372 B2* | 5/2011 | Lee | H04B 3/58 |
| | | | 455/557 |
| 8,149,967 B2* | 4/2012 | Umari | H03G 3/3089 |
| | | | 375/345 |
| 10,165,566 B2* | 12/2018 | Myoung | H04B 1/005 |

FOREIGN PATENT DOCUMENTS

| EP | 3 104 569 A1 | 12/2016 |
| WO | WO 2016/166238 A1 | 10/2016 |

* cited by examiner

*Primary Examiner* — K. Wong
(74) *Attorney, Agent, or Firm* — Muncy, Geissler, Olds & Lowe, P.C.

(57) ABSTRACT

A receiving device for receiving PLC signals, including a filtering stage linked to an input of the receiving device and configurable in at least two modes including a default mode, wherein the filtering stage passes at least first PLC signals included in a first frequency band and second PLC signals included in a second frequency band separate from the first frequency band, and a first selection mode, in which the filtering stage passes the first PLC signals and stops the second PLC signals; and a processing circuit linked to the filtering stage and arranged to receive frames of PLC signals, and, for each received frame, to analyse a preamble of the frame, and to dynamically configure the filtering stage in the first selection mode if the frame is a frame of first PLC signals.

15 Claims, 3 Drawing Sheets

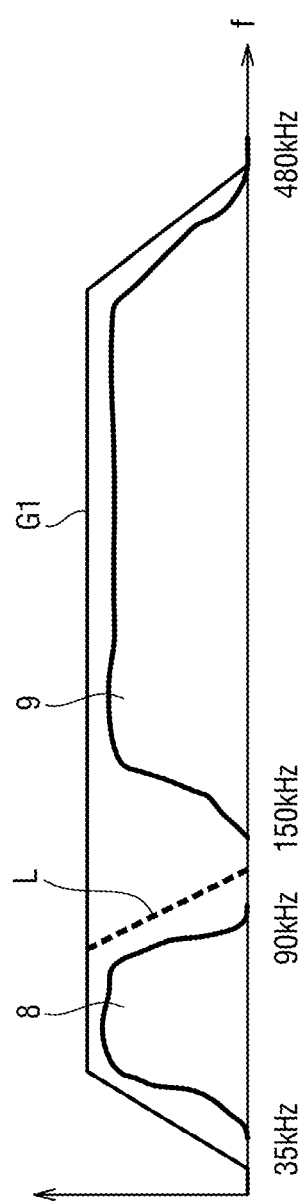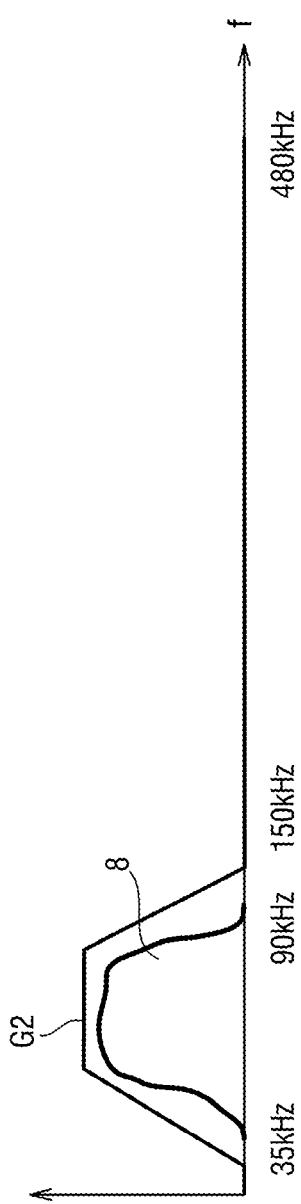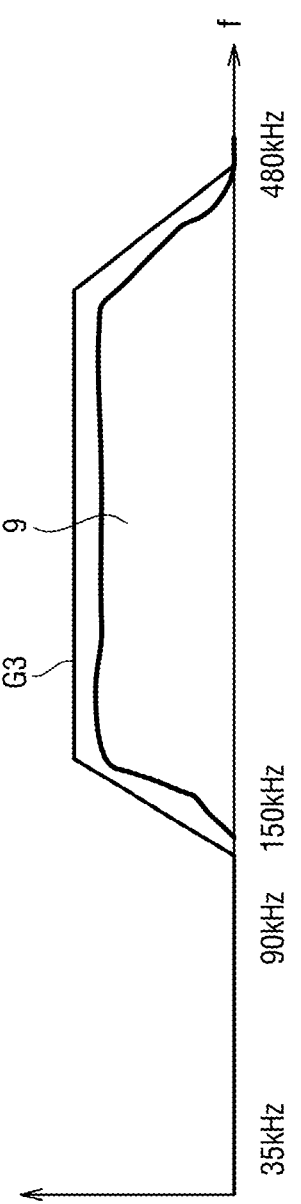

| Sp | Sp | Sp | Sp | Sp | Sp | Sp | Sp | Sm | Sm/2 |
|----|----|----|----|----|----|----|----|----|------|
| S Y N C P | S Y N C P | S Y N C P | S Y N C P | S Y N C P | S Y N C P | S Y N C P | S Y N C P | S Y N C M | S Y N C M |
Fig. 3
Fig. 4
Fig. 5

DEVICE FOR RECEIVING PLC SIGNALS

The invention relates to the field of the devices for receiving PLC signals.

BACKGROUND OF THE INVENTION

Some modern electric meters are designed to communicate via power-line communication ("PLC") and therefore to transmit and receive PLC signals. The G3-PLC protocol has particularly been developed recently to allow optimized management of the so-called "smart" grids.

The PLC according to this protocol mainly uses three frequency bands: the CENELEC A band (frequencies between 35 kHz and 91 kHz), the FCC band (frequencies between 154 kHz and 488 kHz) and the ARIB band (frequencies between 154 kHz and 484 kHz). Other frequency bands can be envisaged, such as the CENELEC B band (frequencies between 98 kHz and 122 kHz). Chinese manufacturers are currently working on a future band G3 M (frequencies between 100 kHz and 2 to 3 MHz).

Each of these frequency bands is defined by a standards body of a country or of a specific continent, and it is therefore intended firstly to be used in this country or in this continent. Thus, the CENELEC A and CENELEC B bands are mainly used in Europe, the FCC band in the United States and the ARIB band in Japan. However, power grids exist that are shared by several frequency bands.

It is understood that it would be very interesting, from an economical point of view, to have available an electric meter that can be used both in a power grid on which a first frequency band is used, for example the CENELEC A band, and in a power grid on which a second frequency band is used, for example the FCC band. Such an electric meter could thus be sold in several countries without changing the PLC interface.

It is also understood that, in the instance where several frequency bands, for example the CENELEC A frequency band and the FCC frequency band, share a same power grid, it is essential for the electric meter to be capable of communicating by using all of these frequency bands or, at the very least, by using a single frequency band but without being disrupted by the presence of the other frequency bands.

However, using such an electric meter is not an easy task. Notably, it is known that the presence, in a power grid, of PLC signals in the FCC band, has a substantial negative impact on the receiving quality of an electric meter provided to communicate in the CENELEC A band.

OBJECT OF THE INVENTION

The object of the invention is to improve the receipt of PLC signals in a power grid when several separate frequency bands can be used on, or even share, the power grid.

SUMMARY OF THE INVENTION

To achieve this aim, a device for receiving PLC signals is proposed, which comprises:
a filtering stage linked to an input of the receiving device and configurable in at least two modes comprising a default mode, wherein the filtering stage passes at least first PLC signals included in a first frequency band and second PLC signals included in a second frequency band separate from the first frequency band, and a first selection mode, in which the filtering stage passes the first PLC signals and stops the second PLC signals;
a processing circuit linked to the filtering stage and arranged to receive frames of PLC signals, and, for each received frame, to analyse a preamble of the frame in order to determine if the frame is a frame of first PLC signals or of second PLC signals, and to dynamically configure the filtering stage in the first selection mode if the frame is a frame of first PLC signals such as to optimize the receipt and the decoding of said frame.

For each received frame, the receiving device according to the invention analyses the preamble of the frame, determines if it is a frame of first PLC signals or of second PLC signals, and dynamically adapts the filtering. Thus, for each frame received in a specific frequency band, the receiving device optimizes both the receipt of the frame and the rejection of the other frequency bands. The receiving device therefore makes it possible to equally receive frames of first PLC signals and of second PLC signals, with an excellent signal-to-noise ratio, even when these frames share a same power grid.

Furthermore, electric equipment is proposed which includes the receiving device that has been described above.

Moreover, a method for receiving PLC signals is proposed, which uses the receiving device that has been described above, comprising the steps, for each received frame, of:
before receiving the frame, configuring the filtering stage in the default mode;
acquiring and analysing the preamble of the frame, such as to determine if the frame is a frame of first PLC signals or of second PLC signals;
dynamically configuring the filtering stage in the first selection mode if the frame is a frame of first PLC signals.

Furthermore, a computer program is proposed which comprises instructions for implementing, via a processing component of a modem, the receiving method which has been described above.

Furthermore, storage means are proposed, characterized in that they store a computer program comprising instructions for implementing, via a processing component of a modem, the receiving method that has been described above.

The invention will be better understood upon reading the following description of a specific nonlimiting embodiment of the invention.

BRIEF DESCRIPTION OF THE DRAWINGS

Reference will be made to the appended drawings, wherein:

FIG. 2a represents a graph on which a curve of a gain of a base filter is represented;

FIG. 2b represents a graph on which a curve of a gain of a first additional filtering circuit is represented;

FIG. 2c represents a graph on which a curve of a gain of a second additional filtering circuit is represented;

FIG. 3 represents symbols of a preamble of a frame of a PLC signal;

FIG. 4 represents electrical signals corresponding to an SYNCP symbol of FIG. 3, for a frame of a first PLC signal (CENELEC A band);

FIG. 5 represents electrical signals corresponding to an SYNCP symbol of FIG. 3, for a frame of a second PLC signal (FCC band).

DETAILED DESCRIPTION OF THE INVENTION

Figure 1:
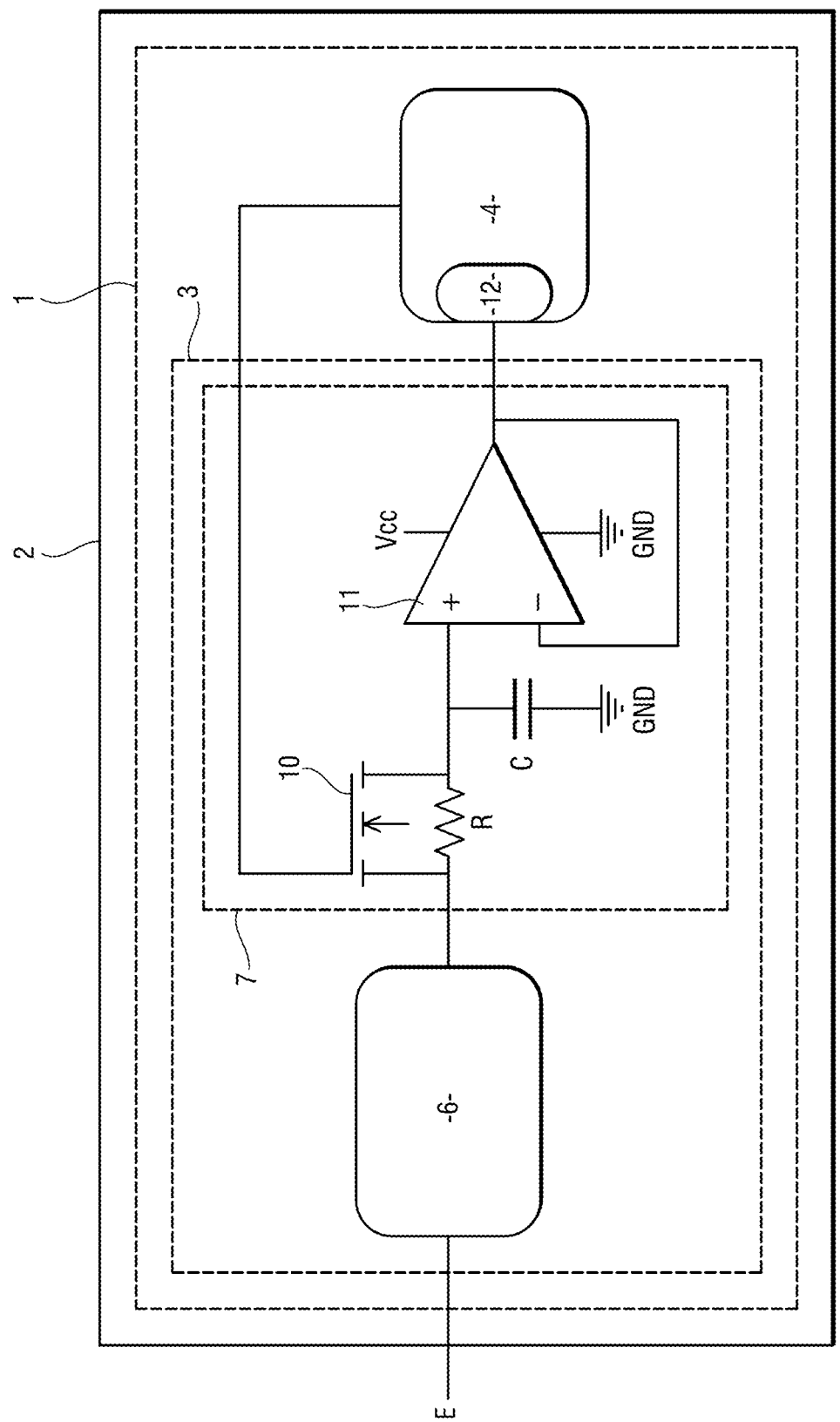
FIG. 1 represents a diagram of a receiving device according to the invention.

Referring to FIG. 1, the receiving device according to the invention 1 is, in this case, used in an electric meter 2. The electric meter 2 is used to measure the electric power consumption of an installation which is linked to a power grid.

The receiving device 1 allows the electric meter 2 to receive PLC signals circulating on the power grid. Two separate frequency bands share the power grid: a first frequency band, in this case the CENELEC A band, and a second frequency band, in this case the FCC band. These two frequency bands are also "disjoint", i.e. they do not overlap and therefore do not have any frequency in common.

The receiving device 1 includes an input E linked to the power grid, a filtering stage 3, and a processing circuit 4.

The filtering stage 3 is linked to the input E of the receiving device 1, such that the PLC signals received by the receiving device 1 pass directly into the filtering stage 3.

The filtering stage 3 includes a base filter 6 and an additional filtering circuit 7 which in this case is positioned at the output of the base filter 6.

The gain G1 of the base filter 6 can be seen in FIG. 2a. It is seen that the base filter 6 passes both first PLC signals included in the first frequency band (CENELEC A) 8 and second PLC signals included in the second frequency band (FCC) 9. The base filter 6 acts as a high-pass filter for the first frequency band 8, i.e. it eliminates the frequencies lower than the first frequency band 8 and it passes the frequencies greater than the first frequency band 8, and as a low-pass filter for the second frequency band 9, i.e. it eliminates the frequencies greater than the second frequency band 9 and it passes the frequencies lower than the second frequency band 9.

The additional filtering circuit 7 comprises a resistor R, a capacitor C, a switching component 10 and an operational amplifier 11. The resistor R in this case has a resistance value of 1.3 kΩ (accurate to 1%). The capacitor C has a capacitance value of 1 nf (accurate to 5%). The resistor R has a first terminal linked to the output of the base filter 6 and a second terminal linked to a first terminal of the capacitor C. The capacitor C has a second terminal linked to the earth GND. The resistor R and the capacitor C form a low-pass RC filter with a cut-off frequency fc such that:

$$fc = 1/2\pi RC = 122.43 \text{ kHz}.$$

The switching component 10 in this case is an N-type MOSFET transistor which is mounted between the terminals of the resistor R. The drain of the transistor 10 is connected to the first terminal of the resistor R and the source of the transistor 10 is connected to the second terminal of the resistor R.

The second terminal of the resistor R and the first terminal of the capacitor C are linked to a non-inverting input of the operational amplifier 11. The inverting input of the operational amplifier 11 is linked to the output of the operational amplifier 11. The operational amplifier 11 is thus connected as a follower.

The processing circuit 4 in this case is a G3-PLC modem. The processing circuit 4 includes a processing component (not represented). The processing component in this case is a microcontroller but could be a different component, for example a processor, a FPGA, an ASIC, etc. The processing component is suitable for executing instructions of a program in order to implement the receipt of the PLC signals.

The processing circuit 4 includes an analogue-to-digital converter 12 which is linked to the output of the operational amplifier 11. The analogue-to-digital converter 12 therefore digitizes the PLC signals which are routed through the filtering stage 3.

The processing circuit 4 is linked to the gate of the transistor 10. The processing circuit 4 can therefore drive the transistor 10 such that the latter is selectively in an open state or in a closed state.

The operation of the receiving device according to the invention 1 is now described in greater detail.

The filtering stage 3, thanks to the transistor 10, is configurable in at least two modes: a default mode and a first selection mode.

The default mode is a mode in which the transistor 10 is in a first state, which is a closed state. In this case, the resistor R is bypassed and the additional filtering circuit 7 only fulfils a follower function at the output of the base filter 6. The additional filtering circuit 7 does not modify the filtering carried out by the base filter 6.

The processing circuit 4 configures the filtering stage 3 in the default mode before the receipt of each new frame, i.e. it commands the transistor 10 such that the latter is in a closed state.

When a frame of PLC signals is received, the PLC signals pass through the filtering stage 3 (via the base filter 6 and the follower-forming additional filtering circuit 7), and are acquired and digitized by the analogue-to-digital converter 12 of the processing circuit 4.

The processing circuit 4 analyses the preamble of the frame in order to determine if the frame is a frame of first PLC signals or of second PLC signals.

Referring to FIG. 3, the preamble of a frame of PLC signals in the G3-PLC protocol comprises an SYNCP (Sp) symbol, repeated eight times, then an SYNCM (Sm; repeated 1.5 times) which is in phase opposition with respect to the SYNCP symbol. This is applicable both for the first PLC signals (CENELEC A) and for the second PLC signals (FCC).

Referring to FIG. 4, in the case of the first PLC signals, each symbol is sent via 36 consecutive carriers P0-P35 ranging from 35 kHz to 91 kHz. In the case of the second PLC signals, referring to FIG. 5, each symbol is sent via 72 consecutive carriers P0-P71 ranging from 154 kHz to 488 kHz.

The processing circuit 4 therefore analyses the preamble of the received frame or, more precisely, samples of the preamble of the frame, said samples being produced by the analogue-to-digital converter 12.

This analysis can comprise the step of applying an inverse Fourier transform to the samples of the preamble of the frame. The inverse Fourier transform makes it possible to determine which frequencies make up the symbols, and therefore if the frame is a frame of first PLC signals or of second PLC signals.

This analysis can alternatively comprise the step of calculating a cross-correlation between the samples of the preamble and a reference signal.

The reference signal is, for example, a preamble of a reference CENELEC A frame.

The analysis is carried out on a predetermined number of symbols of the preamble of the received frame, for example on five symbols.

The predetermined number can be a number other than five. It is preferable to not carry out the analysis on an excessively large number of symbols, such that this analysis indeed finishes before the end of the preamble. A predetermined number equal to five corresponds to a good compromise for the analysis to be sufficiently accurate without being too long.

The N samples corresponding to the reference signal are denoted as $X1_m$, and the N samples of the preamble of the received frame are denoted as $X2_n$. The sum S is then calculated which is such that:

$$S = \Sigma_{n=0}^{N-1} \Sigma_{m=0}^{N-1} X2_n \cdot X1_m$$

When the preamble and the reference signal are of the same nature (i.e. in this case both CENELEC A PLC signals), the noise is averaged and cancels itself out. The value of the sum S is therefore indicative of a correlation present between the preamble of the received frame and the reference signal. The sum S reaches a peak value.

Thus, when the sum S is strictly positive and is greater than a predefined threshold Scor, it is considered that the preamble and the reference signal are of the same nature.

By contrast, when the sum S is almost zero and is strictly less than the predefined threshold Scor, it is deduced therefrom that the preamble of the received frame and the reference signal are of the same nature.

Of course, it is possible to also use, as the reference signal, a preamble of a reference FCC frame, or even calculate the sum S of the preamble of each received frame with the two reference signals (CENELEC A and FCC).

If the processing circuit 4 detects that the preamble of the received frame corresponds to the preamble of the first PLC signals, the processing circuit 4 configures the filtering stage 3 in the first selection mode. The processing circuit 4 commands the transistor 10 such that it passes into a second state, which is an open state.

When the transistor 10 is in the open state, the additional filtering circuit 7 fulfils a filter function which is added to the base filter 6. The resistor R is no longer bypassed and the low-pass RC filter is active and acts upon the base filter 6. The gain of the filtering stage 3 is then defined in the upper frequencies by the dotted line L in FIG. 2a and becomes the gain G2 that can be seen in FIG. 2b. The filtering stage 3 cuts the frequencies just above and just below the first frequency band 8 of the first PLC signals (CENELEC A), and thus rejects the second PLC signals (FCC).

Thus, the possible presence of second PLC signals on the power grid does not disrupt the receipt of the rest of the received frame. The receipt and the decoding of the frame are dynamically optimized, during the receipt of the frame, using the analysis of the preamble of said frame. The signal-to-noise ratio is reduced when receiving the first PLC signals.

By contrast, if the processing circuit 4 detects that the preamble of the received frame does not correspond to the preamble of the first PLC signals, but to the preamble of the second PLC signals, the processing circuit 4 allows the filtering stage 3 into the default mode. The gain of the filtering stage 3 therefore corresponds to the gain G1. The filtering stage 3 passes both the first PLC signals and the second PLC signals. The receipt and the decoding of the rest of the frame are not however disrupted. Indeed, it has been noted that the receipt of frames belonging to the second PLC signals (FCC) is not disrupted by the presence of frames of the first PLC signals (CENELEC A).

Finally, following the complete receipt of the frame, regardless of the nature of the frame that has just been received (CENELEC A or FCC), the processing circuit 4 reconfigures the filtering stage 3 in the default mode by commanding the transistor 10 to the closed state.

Each frame is then processed by the electric meter 2 following the receipt thereof, i.e. acquired and analysed if the electric meter 2 is the intended recipient of the frame, or indeed rejected or re-sent over the power grid if the electric meter 2 is not the recipient of the frame.

It is noted in this case that the reconfiguration of the filtering stage 3 by the processing circuit 4 uses only one switching component (MOSFET transistor 10). This feature is particularly advantageous. Indeed, with two MOSFET transistors, the switching operations would not occur exactly the same time, since the switching time of a MOSFET is not precisely controlled. The use of two MOSFET transistors would produce interfering transient signals which would disrupt the receipt of the frame. In the receiving device according to the invention 1, a single MOSFET transistor 10 is used and this prevents the presence of these interfering transient signals.

Advantageously, it would be possible to envisage the possibility of configuring the filtering stage 3 in a second selection mode, wherein the filtering stage 3 passes the second PLC signals and prevents the passage of the first PLC signals.

For this purpose, a second additional filtering circuit is added, which comprises, for example, a MOSFET transistor, a high-pass RC filter having a cut-off frequency close to but less than 150 kHz, and an amplifier connected as a follower. The MOSFET transistor is, for example, mounted between the terminals of the capacitor.

Thus, during the analysis of the preamble of each received frame, if the processing circuit 4 determines that the frame being received is a frame of the second PLC signals, the processing circuit 4 configures the filtering stage 3 in the second selection mode. The gain of the filtering stage 3 becomes the gain G3, which can be seen in FIG. 2c. The filtering stage 3 cuts off the frequencies just above and just below the second frequency band 9 of the second PLC signals (FCC).

It is observed that, in this case, even if the filtering stage 3 comprises two MOSFET transistors (one for the first additional filtering circuit intended to optimize the receipt of the first PLC signals and one for the second additional filtering circuit intended to optimize the receipt of the second PLC signals), this does not however generate the interfering transient signals that have been mentioned above. Indeed, the processing circuit 4 reconfigures the filtering stage 3 in the default mode before the receipt of each new frame, which amounts to having the two MOSFET transistors in the closed state. If the processing circuit 4 determines that the frame is a frame of first PLC signals, only the MOSFET transistor of the first additional filtering circuit is activated in order to change to the open state. Likewise, if the processing circuit 4 determines that the frame is a frame of second PLC signals, only the MOSFET transistor of the second additional filtering circuit is activated in order to change to the open state.

Of course, the invention is not limited to the described embodiment but covers any alternative falling within the scope of the invention as defined by the claims.

It is clear that the first PLC signals can be signals other than CENELEC A signals and that the second PLC signals can be signals other than FCC signals. For example, it would be possible to replace the signals of the FCC band with signals of the ARIB band.

It would also be possible to have more than two different frequency bands sharing the power grid, and for example the CENELEC A band, the CENELEC B band and the FCC band. The filtering stage is, in this case, configured to optimize as best as possible the receipt of these three bands.

A description has been given herein regarding the use of a base filter associated either with a single additional filtering circuit (a low-pass RC filter), or with a first additional filtering circuit (a low-pass RC filter) and with a second additional filtering circuit (a high-pass RC filter).

It can of course be envisaged to use different filters, configured in a different manner. For example, it would be possible to have a single low-pass filter having two cut-off frequencies each obtained thanks to two different resistors R and R'. It can then be envisaged to use two transistors each mounted at the terminals of one of the resistors R, R'. The configuration in a first selection mode would consist in changing to the open state the transistor at the terminals of the resistor R, whereas the configuration in a second selection mode would consist in changing to the open state the transistor at the terminals of the resistor R'. The configuration in the default mode would consist in changing back to be closed state the transistor which was in the open state.

It would also be possible for the switching component to not be used by being mounted at the terminals of the component, but to be used to carry out the selective connection or disconnection of a component to/from the rest of the filtering stage.

The wiring diagram of the receiving device could therefore certainly be different to that shown in FIG. 1.

For example, it would be possible to merge the additional filtering circuit and the base filter with the aim of reducing the installation surface area on the electrical board, as well as the number and the cost of the components: components of the additional filtering circuit would then be integrated into the base filter.

It would also be possible to position the low-pass RC filter after the operational amplifier (i.e. between the operational amplifier and the processing circuit), such as to make the additional filtering circuit and the base filter completely independent of one another.

Although it has been described herein that the receiving device is integrated into an electric meter, it could be integrated into any electrical equipment that can receive PLC signals.

The invention claimed is:

1. A receiving device for receiving power-line communication (PLC) signals, comprising:
    a filtering stage linked to an input of the receiving device and configurable in at least two modes comprising a default mode, wherein the filtering stage passes at least first PLC signals included in a first frequency band and second PLC signals included in a second frequency band separate from the first frequency band, and a first selection mode, in which the filtering stage passes the first PLC signals and stops the second PLC signals;
    a processing circuit linked to the filtering stage and arranged to receive frames of PLC signals, and, for each received frame, to analyse a preamble of the frame in order to determine if the frame is a frame of first PLC signals or of second PLC signals, and to dynamically configure the filtering stage in the first selection mode if the frame is a frame of first PLC signals such as the optimize the receipt and the decoding of said frame.

2. The receiving device according to claim 1, wherein the processing circuit is arranged to configure the filtering stage in the default mode before the receipt of each new frame.

3. The receiving device according to claim 1, wherein the filtering stage comprises a switching component used to configure the filtering stage and arranged such that, when the switching component is in a first state, the filtering stage is in the default mode, and when the switching component is in a second state, the filtering stage is in the first selection mode.

4. The receiving device according to claim 3, wherein the filtering stage includes a base filter and an additional filtering circuit , and wherein the switching component is a transistor mounted between the terminals of a component of the additional filtering circuit.

5. The receiving device according to claim 4, wherein the additional filtering circuit further includes an operational amplifier connected as a follower, the additional filtering circuit being arranged such that, when the transistor is in an open state, the additional filtering circuit fulfils a filter function, and when the transistor is in a closed state, the additional filtering circuit only fulfils a follower function.

6. The receiving device according to claim 5, wherein the additional filtering circuit comprises a low-pass RC filter comprising a resistor between the terminals of which the transistor is mounted, or a high-pass RC filter comprising a capacitor between the terminals of which the transistor is mounted.

7. The receiving device according to claim 4, wherein the additional filtering circuit is mounted at the output of the base filter.

8. The receiving device according to claim 4, wherein components of the additional filtering circuit are integrated into the base filter.

9. The receiving device according to claim 1, wherein the filtering stage is furthermore configurable in a second selection mode, wherein the filtering stage passes the second PLC signals and stops the first PLC signals.

10. The receiving device according to claim 1, wherein, in order to analyse the preamble of the frame, the processing circuit is arranged to apply an inverse Fourier transform to samples of the preamble or to calculate a cross-correlation between the samples and a reference signal.

11. An electrical equipment comprising the receiving device according to claim 1.

12. The electrical equipment according to claim 11, the electrical equipment being an electric meter.

13. A method for receiving PLC signals, which uses the receiving device according to claim 1, comprising the steps, for each received frame, of:
    before receiving the frame, configuring the filtering stage in the default mode;
    acquiring and analysing the preamble of the frame, such as to determine if the frame is a frame of first PLC signals or of second PLC signals;
    dynamically configuring the filtering stage in the first selection mode if the frame is a frame of first PLC signals.

14. A computer program comprising program code instructions for the execution of the steps of the receiving method according to claim 13 when said program is executed on a computer.

15. A storage means, for storing a computer program comprising instructions for implementing, via a processing component of a modem, the receiving method according to claim 13.

* * * * *